United States Patent [19]

Ino et al.

[11] Patent Number: 5,506,581
[45] Date of Patent: Apr. 9, 1996

[54] MODULATING METHOD, MODULATING DEVICE AND DEMODULATING DEVICE

[75] Inventors: Hiroyuki Ino, Chiba; Takashi Sato, Miyagi; Toshiyuki Nakagawa, Kanagawa, all of Japan

[73] Assignee: Sony Corporation, Japan

[21] Appl. No.: 147,836

[22] Filed: Nov. 5, 1993

[30] Foreign Application Priority Data

Nov. 9, 1992 [JP] Japan .................................. 4-298670
Jun. 4, 1993 [JP] Japan .................................. 5-134287

[51] Int. Cl.⁶ .................................................. H03M 7/00
[52] U.S. Cl. .................................................. 341/58; 341/68
[58] Field of Search .......................... 341/58, 59, 68, 341/69, 70, 71, 72; 360/41

[56] References Cited

U.S. PATENT DOCUMENTS

| 5,151,699 | 9/1992 | Moriyama | 341/58 |
| 5,349,349 | 9/1994 | Shimizume | 341/58 |
| 5,365,231 | 11/1994 | Niimura | 341/58 |

FOREIGN PATENT DOCUMENTS

| 0058081A3 | 8/1982 | European Pat. Off. . |
| 0074656A3 | 3/1983 | European Pat. Off. . |
| 0347934A3 | 12/1989 | European Pat. Off. . |
| 0476766A1 | 3/1992 | European Pat. Off. . |
| 0511498A3 | 11/1992 | European Pat. Off. . |

*Primary Examiner*—A. D. Pellinen
*Assistant Examiner*—Peguy Jean Pierre
*Attorney, Agent, or Firm*—Limbach & Limbach; Charles P. Sammut

[57] ABSTRACT

A modulating method, a modulating device and a demodulating device, in which it is possible to improve the digital sum value (DSV) of the coded information, modulated for transmission or recording on the recording medium, are disclosed. An encoding circuit 11 translates a sequence of input data into a sequence of coded data suitable for transmission. A pattern generating circuit 12 generates a pattern of a pre-set length at a pre-set interval inversely proportionate to the low-range cut-off frequency of the modulated coded data. A pattern inserting circuit 13 inserts the patterns into the sequence of coded data A at the pre-set interval. A modulating circuit 14 NRZI modulates the pattern-interlaced sequence of the coded data B and outputs the resulting sequence. A timing control circuit 15 controls the pattern inserting circuit 13 an so forth. The DSV of the modulated coded data may be controlled by the inserted patterns, while the increase in redundancy may be maintained at a necessary minimum value to adapt the DSV control characteristics to the specifications demanded by the transmission system.

30 Claims, 6 Drawing Sheets

MODULATING METHOD, MODULATING DEVICE AND DEMODULATING DEVICE

DETAILED DESCRIPTION OF THE INVENTION

1. Field of the Invention

This invention relates to a modulating method, a modulating device and a demodulating device in which it is possible to improve the digital sum value (DSV) of the coded information, modulated for transmission or recording on the recording medium.

2. Prior Art

When transmitting the information or recording the information on a recording medium, such as a magnetic tape, a magnetic disc of an optical disc, the information is encoded and modulated for transmission of recording, and the resulting coded and modulated information is transmitted. Meanwhile, in order to prevent errors from being produced due to fluctuations in the reference level incurred when converting the playback signals into hi-level of digital signals during reproduction, or to prevent fluctuations in various error signals, such as tracking error signals employed for servo control e.g. of disc devices, it is mandatory that the coded modulated information be free of dc components.

The digital sum value, which is the sum of data symbols "1" and "0" since the start time of the sequence of coded and modulated information, with the data symbols "1" and "0" being set to +1 and −1, respectively, represents a measure for evaluation of the dc components in the sense that, if the absolute value of the DSV is small, the amount of dc components or the low-range components is small.

Consequently, DSV control is performed in the modulation systems, such as 8 to 10 modulation system employed in a digital audio tape recorder (DAT), 8 to 14 modulation system employed in a compact disc (CD) player or a Miller$^2$ (Miller square) modulation system employed in a magnetic disc device, for reducing the absolute value of the DSV in the wake of the non-return-to-zero (NRZ) modulation which is the so-called mark position modulation or the non-return-to-zero inverted (NRZI) modulation which is the mark length modulation.

Problem to be Solved by the Invention

In other words, in these modulation systems, the DSV control characteristics are set unequivocally to render it difficult to adapt the DSV control characteristics to the demands raised by the transmission system or to the recording/reproducing system. For example, it has been a frequent occurrence that the DSV control characteristics fail to meet the demands raised by the transmission system, or conversely, the DSV control characteristics more than meet the demands raised by the transmission system, that is, manifest excess redundancy.

On the other hand, in the general codes, such as the so-called (d, k; m, n; r) code having the minimum run of 0s equal to $\underline{d}$ and the maximum run of 0s equal to $\underline{k}$, which code represents a fixed length code or the variable length code for r=1 or r≠1, respectively, the DSV control is not made, so that errors are likely to be produced due to the dc components. Although it is possible to design the code to take account of the DSV control characteristics, the number of control items and redundancy tend to be increased.

In view of the above-depicted problems of the prior art, it is an object of the present invention to provide a modulating method, a modulating device and a decoding device wherein the increase in redundance may be maintained at a necessary minimum value for the codes not taking account of DSV control in order to enable the DSV control to be made to meet the demands raised by the transmission system.

Means to Solve the Problem

For accomplishing the above object, the first modulating method according to the present invention consists in inserting patterns each having a pre-set length into a sequence of coded data at a pre-set interval, and NRZI modulating the sequence of coded data interlaced with the patterns for outputting the DSV controlled modulated code.

The second modulating method according to the present invention consists in inserting a pattern having a length equal to 2 (d+1) bits at a pre-set interval into a sequence of (d, k) coded information, and NRZI modulating the sequence of (d, k) coded information interlaced with said patterns for outputting the DSV controlled modulated coded information, The third modulating method according to the present invention, related to the first or second modulating method, consists in that the pre-set interval is of a value inversely proportional to the low-range cut-off frequency of the modulated coded information.

The fourth modulating method according to the present invention, related to the first or second modulating method, consists in that the patterns comprise three different patterns, that is a pattern with 0 "1", a pattern 1 "1" and a pattern with 2 "1"s.

The fifth modulating method according to the present invention related to the third modulating method consists in that the patterns comprise three different, patterns, that is a pattern with 0 "1", a pattern with 1 "1" and a pattern with 2 "1"s.

The sixth modulating method according to the present invention related to the fourth modulating method comprises summing the DSV upstream of a currently inserted pattern to the DSV of a sequence of coded information between the currently inserted pattern and a pattern to be inserted next time and selectively inserting one of said three different patterns which will give the smallest absolute sum value.

The seventh modulating method according to the present invention related to the fifth modulating method comprises summing the DSV upstream of a currently inserted pattern to the DSV of a sequence of coded information between the currently inserted pattern and a pattern to be inserted next time and selectively inserting one of the three different patterns which will give the smallest absolute sum value.

The first modulating method according to the present invention comprises pattern inserting means for inserting patterns each being of a pre-set length into a sequence of coded information, and modulating means for NRZI modulating the sequence of coded information interlaced with the patterns from the pattern inserting means, wherein the modulating means outputs the sequence of DSV controlled modulated coded information.

The second modulating method according to the present invention comprises pattern inserting means for inserting patterns each being of a length equal to 2 (d+1) bits into a sequence of (d, k) coded information at a pre-set interval, and modulating means for NRZI modulating the sequence of (d, k) coded information interlaced with the patterns from the pattern inserting means, wherein the modulating means outputs the DSV controlled modulated coded information.

The third modulating device according to the present invention, related to the first or second modulating device, is so designed that the pattern inserting means insert the patterns at a pre-set interval inversely proportional to the low-range cut-off frequency of said modulated code information.

The fourth modulating device according to the present invention, related to the first or second modulating device, is so designed that the pattern inserting means select and insert one of three different patterns, that is a pattern with 0 "1", a pattern with 1 "1" and a pattern with 2 "1"s.

The fifth modulating device according to the present invention, related to the third modulating device, is so designed that the pattern inserting means select and insert one of three different patterns, that is a pattern with 0 "1", a pattern with 1 "1" and a pattern with 2 "1"s.

The sixth modulating device according to the present invention, related to the fourth modulating device, comprises control means for causing the pattern inserting means to sum the DSV upstream of a currently inserted pattern to the DSV of a sequence of coded information between the currently inserted pattern and a pattern to be inserted next time and to selectively insert one of the three different patterns which will give the smallest absolute sum value.

The seventh modulating device according to the present invention, related to the fifth modulating device, comprises control means for causing the pattern inserting means to sum the DSV upstream of a currently inserted pattern to the DSV of a sequence of coded information between the currently inserted pattern and a pattern to be inserted next time and to selectively insert one of the three different patterns which will give the smallest absolute sum value.

A demodulating device according to the present invention comprises demodulating means supplied with a sequence of modulated coded information previously interlaced with pre-set length patterns at a pre-set interval and subsequently NRZI modulated with DSV control, the demodulating means NRZI demodulating the sequence of modulated coded information and reproducing the sequence of coded information interlaced with the patterns, and pattern removing means for removing the patterns from the sequence of coded information interlaced with the patterns from the demodulating means for reproducing the original sequence of coded information.

The eighth modulating method according to the present invention comprises inserting patterns each being of a length equal to 2 (d+1) bits into a sequence of (d, k) coded information at a pre-set interval, NRZI modulating the sequence of (d, k) coded information interlaced with the patterns from the pattern inserting means, and outputting the sequence of DSV controlled modulated coded information, with the patterns being selected on the basis of (d+1) bits preceding and following insertion of the patterns.

The ninth modulating method according to the present invention, related to the eighth modulating method, comprises selecting the patterns on the basis of (d+1) bits directly following the pattern if 1 is not present in (d+1) bits directly preceding the insertion of the patterns and 1 is present in the (d+1) bits directly following the insertion of the patterns, and selecting the patterns on the basis of the (d+1) bits directly preceding the pattern if 1 is present in the (d+1) bits directly preceding the insertion of the patterns and 1 is not present in the (d+1) bits directly following the insertion of the patterns.

The tenth modulating device according to the present invention, related to the eighth or ninth modulating device, is so designed that, if 1 is not present in the (d+1) bits immediately preceding the inserted pattern nor in the (d+1) bits immediately following the inserted pattern, the pattern is set to a first inverting pattern in which only the (d+1)th bit as counted from the least significant bit as the first bit is 1 or to a first non-inverting pattern having two "1"s and satisfying the coding rule of said (d, k) code; if 1 is not present in the immediately preceding (d+1) bits and 1 is present in the immediately following (d+1) bits, the pattern is set to a second inverting pattern having its upper (d+1) bits equal to the immediately following (d+1) bits and having its lower (d+1) bits all 0, or to a second non-inverting pattern in which the immediately following (d+1) bits are repeated twice; if 1 is present in the immediately preceding (d+1) bits and 1 is not present in the immediately following (d+1) bits, the pattern is set to a third inverting pattern having its upper (d+1) bits all 0 and having its lower (d+1) bits equal to the immediately preceding (d+1) bits or to a third non-inverting pattern in which the immediately preceding (d+1) bits are repeated twice; and, if 1 is present in both of the immediately preceding (d+1) bits and the immediately following (d+1) bits, the pattern is set to the first inverting pattern or a fourth non-inverting pattern consisting of the immediately preceding (d+1) bits and the immediately following (d+1) bits.

The eleventh modulating method according to the present invention, related to the tenth modulating method, is so designed that, if the relation 2d<k<(2d+1) holds, the fourth non-inverting pattern is selected on the basis of d/2 bits, d being an even number, preceding and following the insertion of the pattern, or (d+1)/2 bits, d being an odd number, preceding and following the insertion of the pattern.

The twelfth modulating device according to the present invention, related to the tenth or eleventh modulating device, comprises summing the DSV upstream of a currently inserted pattern to the DSV of a sequence of coded information between the currently inserted pattern and a pattern to be inserted next time and selecting the inverting patterns or the non-inverting patterns so that the absolute sum value becomes the least.

Operation

In the first modulating method, the patterns each being of a pre-set length are inserted at pre-set intervals into a sequence of coded information and subsequently NRZI modulated to output DSV controlled modulated coded information.

In the second modulating method, the patterns each being of a length equal to 2 (d+1) are inserted at pre-set intervals into a sequence of 2 (d+1) coded information and subsequently NRZI modulated to output DSV controlled modulated coded information.

In the third modulating method, related to the first or second modulating method, the pre-set interval is set to a value inversely proportional to the low-range cut-off frequency of the modulated coded information.

In the fourth modulating method, related to the first or second modulating method, the patterns are three different patterns, that is a pattern with 0 "1", a pattern with 1 "1" and a pattern with 2 "1"s.

In the fifth modulating method, related to the first or second modulating method, the patterns are three different patterns, that is a pattern with 0 "1", a pattern with 1 "1" and a pattern with 2 "1"s.

In the sixth modulating method, related to the fourth modulating method, the DSV upstream of the currently inserted pattern is summed to the DSV of the sequence of coded information between the currently inserted pattern and the pattern to be inserted next time, and one of the three different patterns which will give the smallest absolute sum value is selected and inserted.

In the seventh modulating method, related to the fifth modulating method, the DSV upstream of the currently inserted pattern is summed to the DSV of the sequence of coded information between the currently inserted pattern and the pattern to be inserted next time, and one of the three different patterns which will give the smallest absolute sum value is selected and inserted.

In the first modulating device, the patterns each being of a pre-set length are inserted into a sequence of coded information at pre-set intervals and subsequently NRZI modulated for outputting DSV controlled modulated coded information.

In the second modulating device, the patterns each being of a length equal to 2 (d+1) bits are inserted into a sequence of (d, k) coded information at pre-set intervals and subsequently NRZI modulated for outputting DSV controlled modulated coded information.

In the third modulating device, related to the first or second modulating device, the pre-set interval is set to a value inversely proportional to the low-range cut-off frequency of the modulated coded information.

In the fourth modulating device, related to the first or second modulating device, the patterns are three different patterns, that is a pattern with 0 "1", a pattern with 1 "1" and a pattern with 2 "1"s.

In the fifth modulating device, related to the third modulating device, the patterns are three different patterns, that is a pattern with 0 "1", a pattern with 1 "1" and a pattern with 2 "1"s.

In the sixth modulating method, related to the fourth modulating method, the DSV upstream of the currently inserted pattern is summed to the DSV of the sequence of coded information between the currently inserted pattern and the pattern to be inserted next time, and one of the three different patterns which will give the smallest absolute sum value is selected and inserted.

In the seventh modulating method, related to the fifth modulating method, the DSV upstream of the currently inserted pattern is summed to the DSV of the sequence of coded information between the currently inserted pattern and the pattern to be inserted next time, and one of the three different patterns which will give the smallest absolute sum value is selected and inserted.

In the demodulating device, the modulated coded information is NRZI demodulated to reproduce the sequence of coded information interlaced with the patterns, and the patterns are removed from the sequence of coded information to reproduce the original sequence of coded information.

In the eighth modulating method, the patterns each being of a length of 2 (d+1) bits are inserted into a sequence of (d, k) coded information at pre-set intervals and subsequently NRZI modulated to output DSV controlled modulated coded information, in which the patterns are selected on the basis of (d+1) bits preceding and following the pattern insertion.

The ninth modulating method, related to the eighth modulating method, comprises selecting the patterns on the basis of (d+1) bits directly following the pattern if 1 is not present in (d+1) bits directly preceding the insertion of the patterns and 1 is present in the (d+1) bits directly following the insertion of said patterns, and selecting the patterns on the basis of the (d+1) bits directly preceding the pattern if 1 is present in the (d+1) bits directly preceding the insertion of the patterns and 1 is not present in the (d+1) bits directly following the insertion of the patterns.

In the tenth modulating method, related to the eighth or ninth modulating method, the patterns are set to the first inverting pattern or to the first non-inverting pattern if 1 is not present in (d+1) bits immediately preceding the inserted pattern nor in (d+1) bits immediately following the inserted pattern, and the patterns are set to the second inverting pattern or to the second non-inverting pattern if 1 is not present in the immediately preceding (d+1) bits nor in the immediately following (d+1) bits, while the patterns are set to the third inverting pattern or to the third non-inverting pattern if 1 is present in the immediately preceding (d+1) bits and is not present in the immediately following (d+1) bits, and the patterns are set to the first inverting pattern or to the fourth non-inverting pattern if 1 is present in both the immediately preceding (d+1) bits and the immediately following (d+1) bits.

In the eleventh modulating method, related to the tenth modulating method, if the relation 2d<k<(2d+1) holds, the fourth non-inverting pattern is selected on the basis of d/2 bits, $\underline{d}$ being an even number, preceding and following the insertion of the pattern, or (d+1)/2bits, $\underline{d}$ being an odd number, preceding and following the insertion of the pattern.

In the twelfth modulating method, related to the tenth or eleventh modulating method, the DSV upstream of a currently inserted pattern is summed to the DSV of a sequence of coded information between the currently inserted pattern and a pattern to be inserted next time and the inverting patterns or the non-inverting patterns are selected so that the absolute sum value becomes the least.

Embodiments

Referring to the drawings, preferred embodiments of the modulating method, modulating apparatus and the demodulating apparatus are explained in detail. FIG. 1 shows, in a block diagram, the circuit construction of essential parts of a modulating device embodying the present invention.

The modulating device comprises an encoding circuit 11 for translating a sequence of input data into an encoded sequence suited to transmission, and a pattern generating circuit 12 for generating a pattern of a pre-set length at a pre-set interval. The modulating device also comprises a pattern inserting circuit 13 for inserting the patterns from the pattern generating circuit 12 at the pre-set interval, a modulating circuit 14 for non-return to zero inverted (NRZI) modulating the sequence of input coded data interlaced with the patterns inserted by the pattern inserting circuit 13 and outputting the modulated data, and a timing control circuit 15 for controlling the pattern-inserting circuit 13, as shown in FIG. 1.

With the present modulating apparatus, the sequence of input data is translated into a sequence of coded data A suited for transmission or recording, and patterns each consisting of $T_{dc}$ bits providing a pre-set length are inserted into the sequence of encoded data, as shown in FIG. 2. The sequence of encoded data interlaced with the inserted patterns B is NRZI modulated to output so-called digital sum value (DSV) controlled modulated coded data.

Specifically, the encoding circuit 11 translates the sequence of input data into the sequence of coded data A in accordance with the coding rule suited to transmission or recording. For example, the circuit 11 translates the sequence of input data into data coded by the so-called (d, k; m, n; r) code in which the minimum run of "0"s is $\underline{d}$ and the maximum run of "0"s is $\underline{k}$. Specifically, the encoding circuit 11 encodes the sequence of input data based on coding rules not taking account of the DSV control, such as the so-called modified frequency modulation (MFM) which e.g. is the (1, 3; 1, 2; 1) code, the so-called RLL (2, 7) modulation, which is the (2, 7; 1, 2; 1) coding as shown in the following Table 1, or the (4, 22; 2, 5; 5) coding as shown in the following Table 2. Thus the sequence of coded data which is not DSV controlled is outputted by the encoding circuit 11.

TABLE 1

| data words | code words |
|---|---|
| 000 | 000100 |
| 10 | 0100 |
| 010 | 100100 |
| 0010 | 00100100 |
| 11 | 1000 |
| 011 | 001000 |
| 0011 | 00001000 |

TABLE 2

| | data words | code words | | | | |
|---|---|---|---|---|---|---|
| i=1 | 11 | 00000 | | | | |
| | 10 | 10000 | | | | |
| | 111111 | 00001 | 00001 | 00000 | | |
| i=2 | 0111 | 01000 | 00000 | | | |
| | 0110 | 00100 | 00000 | | | |
| | 0101 | 00010 | 00000 | | | |
| | 0100 | 00001 | 00000 | | | |
| i=3 | 001111 | 01000 | 01000 | 00000 | | |
| | 001110 | 01000 | 00100 | 00000 | | |
| | 001101 | 01000 | 00010 | 00000 | | |
| | 001100 | 01000 | 00001 | 00000 | | |
| | 001011 | 00010 | 00001 | 00000 | | |
| | 001010 | 00100 | 00100 | 00000 | | |
| | 001001 | 00100 | 00010 | 00000 | | |
| | 001000 | 00100 | 00001 | 00000 | | |
| | 000111 | 00010 | 00010 | 00000 | | |
| i=4 | 00011011 | 01000 | 01000 | 01000 | 00000 | |
| | 00011010 | 01000 | 01000 | 00100 | 00000 | |
| | 00011001 | 01000 | 01000 | 00010 | 00000 | |
| | 00011000 | 01000 | 01000 | 00001 | 00000 | |
| | 00010111 | 01000 | 00010 | 00001 | 00000 | |
| | 00010110 | 01000 | 00100 | 00100 | 00000 | |
| | 00010101 | 01000 | 00100 | 00010 | 00000 | |
| | 00010100 | 01000 | 00100 | 00001 | 00000 | |
| | 00010011 | 01000 | 00010 | 00010 | 00000 | |
| | 00010010 | 00100 | 00100 | 00100 | 00000 | |
| | 00010001 | 00100 | 00100 | 00010 | 00000 | |
| | 00010000 | 00100 | 00100 | 00001 | 00000 | |
| | 00001111 | 00010 | 00001 | 00001 | 00000 | |
| | 00001110 | 00100 | 00001 | 00001 | 00000 | |
| | 00001101 | 00100 | 00010 | 00010 | 00000 | |
| | 00001100 | 00100 | 00010 | 00001 | 00000 | |
| | 00001011 | 01000 | 00001 | 00001 | 00000 | |
| | 00001010 | 00001 | 00001 | 00001 | 00000 | |
| | 00001001 | 00010 | 00010 | 00010 | 00000 | |
| | 00001000 | 00010 | 00010 | 00001 | 00000 | |
| i=5 | 0000011111 | 01000 | 01000 | 01000 | 01000 | 00000 |
| | 0000011110 | 01000 | 01000 | 01000 | 00100 | 00000 |
| | 0000011101 | 01000 | 01000 | 01000 | 00010 | 00000 |
| | 0000011100 | 01000 | 01000 | 01000 | 00001 | 00000 |
| | 0000011011 | 01000 | 01000 | 00010 | 00001 | 00000 |
| | 0000011010 | 01000 | 01000 | 00100 | 00100 | 00000 |
| | 0000011001 | 01000 | 01000 | 00100 | 00010 | 00000 |
| | 0000011000 | 01000 | 01000 | 00100 | 00001 | 00000 |
| | 0000010111 | 01000 | 01000 | 00010 | 00010 | 00000 |
| | 0000010110 | 01000 | 00100 | 00100 | 00100 | 00000 |

TABLE 2-continued

| data words | code words | | | | |
|---|---|---|---|---|---|
| 0000010101 | 01000 | 00100 | 00100 | 00010 | 00000 |
| 0000010100 | 01000 | 00100 | 00100 | 00001 | 00000 |
| 0000010011 | 01000 | 00010 | 00001 | 00001 | 00000 |
| 0000010010 | 01000 | 00100 | 00001 | 00001 | 00000 |
| 0000010001 | 01000 | 00100 | 00010 | 00010 | 00000 |
| 0000010000 | 01000 | 00100 | 00010 | 00001 | 00000 |
| 0000001111 | 01000 | 01000 | 00001 | 00001 | 00000 |
| 0000001110 | 01000 | 00001 | 00001 | 00001 | 00000 |
| 0000001101 | 01000 | 00010 | 00010 | 00010 | 00000 |
| 0000001100 | 01000 | 00010 | 00010 | 00001 | 00000 |
| 0000001011 | 00100 | 00100 | 00010 | 00010 | 00000 |
| 0000001010 | 00100 | 00100 | 00100 | 00100 | 00000 |
| 0000001001 | 00100 | 00100 | 00100 | 00010 | 00000 |
| 0000001000 | 00100 | 00100 | 00100 | 00001 | 00000 |
| 0000000111 | 00100 | 00100 | 00010 | 00001 | 00000 |
| 0000000110 | 00100 | 00100 | 00001 | 00001 | 00000 |
| 0000000101 | 00100 | 00010 | 00010 | 00010 | 00000 |
| 0000000100 | 00100 | 00010 | 00010 | 00001 | 00000 |
| 0000000011 | 00100 | 00001 | 00001 | 00001 | 00000 |
| 0000000010 | 00010 | 00010 | 00001 | 00001 | 00000 |
| 0000000001 | 00010 | 00010 | 00010 | 00010 | 00000 |
| 0000000000 | 00010 | 00010 | 00010 | 00001 | 00000 |
| | 00010 | 00001 | 00001 | 00001 | 00000 |
| | 00001 | 00001 | 00001 | 00001 | 00000 |
| SYNC for mod2to4d5 | | | | | |
| ASYNC | | 23T | 21T | 6T | |
| BSYNC | | 21T | 23T | 6T | |

The pattern generating circuit 12 generates patterns consisting of $T_{dc}$ bits at pre-set intervals each consisting of $T_{code}$ bits based on the sequence of coded data A supplied from the encoding circuit 11. The pattern inserting circuit 13 inserts the patterns each consisting of $T_{dc}$ bits supplied from the pattern generating circuit 12 at the pre-set intervals $T_{code}$ into the sequence of coded data A supplied from the encoding circuit 11 for generating the sequence of coded data B. The modulating circuit 14 NRZI modulates the sequence of coded data B supplied from the pattern inserting circuit 13 for generating the modulated coded data which are outputted. Synchronizing signals and so forth are appended to the coded modulated data which are transmitted or recorded.

Meanwhile, the coded modulated data outputted from the modulating circuit 14 has its logic inverted downstream of the inserted pattern, that is "0" and "1" in the data are inverted to "1" and "0", respectively, if the number of "1"s in the inserted pattern is an odd number, whereas the logic inversion is not incurred if the number of "1"s is an even number. According to the present invention, the patterns inserted into the sequence of coded data A are selected for controlling the DSV of the coded modulated data. The pattern in which it is possible to minimize an increase in redundancy is that in which the number of "1"s is 0 or 1. Consequently, the above-mentioned pattern generating circuit 12 generates patterns in which the number of "1"s is 0 or 1. Meanwhile, with the pattern in which the number of "1"s is 0, the run of consecutive "0"s occasionally exceeds the maximum run "k", depending on the coding rule employed. For such code, the pattern in which the number of "1"s is two is generated in lieu of the pattern in which the number of "1"s is 0. That is, the pattern generating circuit generates three different patterns, that is the patterns in which the number of "1"s is 0, 1 and 2.

On the other hand, if, when the patterns are inserted by the pattern inserting circuit 13 at arbitrary positions of the sequence of coded data A, the sequence of coded data B is to satisfy the (d, k) coding rule, the minimum length, that is the pre-set length defined by $T_{dc}$ bits, of the pattern having the number of "1"s equal to 2, and that of the pattern having the number of "1"s equal to 1, are respectively given by the Following equations 1 and 2:

$$T_{dc}=(d-S_1)+1+d+1+(d-(d-S_1))=2(d+1) \quad \text{Equation 1}$$

$$T_{dc}=(d-S_1)+1+(d-(d-(d-S_1))=d+1 \quad \text{Equation 2}$$

Meanwhile, in the equations 1 and 2, $S_1$ stands for the number of consecutive "0"s upstream of the inserted pattern, and satisfies the condition of $0 \leq S_1 \leq k$. Therefore, if the (d, k) code is employed in the encoding circuit 11, the pattern generating circuit 12 generates a pattern consisting of 2 (d+1) bits. If $k=\infty$, the above-mentioned pattern in which the number of "1"s is 0 may be employed, in which case the pattern having (d+1) bits is generated.

Specifically, for the (4, 22; 2, 5; 5) code, for example, the pattern generating circuit 12 selectively generates one of patterns "0000000000", "0000100001" or "1000010000", referred to herein as even "1" number group patterns, and a pattern "0000100000", referred to herein as odd "1" number group pattern, these being patterns consisting of 10 (=2×(4+1)) bits. Selection of the patterns is by the algorithm which is hereinafter explained.

The DSV upstream of the pattern $b_1$ now to be inserted is summed to the DSV of a sequence of coded data between the pattern $b_1$ and a pattern $b_2$ to be inserted next time and one of the even "1" number group patterns and the odd "1" number group pattern is selected so that the absolute value of the sum becomes smaller, as shown for example in FIG. 2.

On the other hand, selection of one of the even "1" number group patterns is so made that, if four consecutive "0"s are present directly after or before the inserted pattern, the patterns "0000100001" or "1000010000" is selected, respectively, while the pattern "0000000000" is selected otherwise.

For RLL (2, 7) modulation, for example, the pattern generating circuit 12 selectively generates one of patterns "001001", "100100" or "010010", referred to herein as even "1" number group patterns, or patterns "1000000", "010000", "001000", "000100", "000010" or "000001", referred to herein as odd "1" number group pattern, these being patterns consisting of 6 (=2×(2+1)) bits. Selection of one of the even "1" number group patterns is so made that, if the pattern immediately preceding the inserted pattern ends with "1" or the pattern immediately succeeding the inserted bit begins with "1", the pattern "001001" or "100100" is selected and, if otherwise, the pattern "010010" is selected is selected. Meanwhile, there is no limitation as to the selection of the odd "1" number group pattern.

On the other hand, the timing control circuit 15 controls the pattern generating circuit 12 and the pattern inserting circuit 13 so that the patterns each consisting of $T_{dc}$ bits are inserted into the sequence of coded data A at the pre-set intervals $T_{code}$. The control is so made that the pre-set interval of $T_{code}$ bits is inversely proportional to the low range cut-off frequency of the coded modulated data. Specifically, if the low range cut-of frequency is $f_c$, the low-range cut-off frequency $f_c$ is inversely proportional to the pre-set interval of $T_{code}$ bits, as shown by the equation 3. The timing controlling circuit 15 controls the pattern generating circuit 12 and the pattern generating circuit 13 based on the pre-set interval of $T_{code}$ bits produced based on the equation 3.

$$f_c=K/(T_{code}+T_{dc}) \quad \text{Equation 3}$$

Meanwhile, the value of the coefficient K is a value based on the coding rule. For the above-mentioned (4, 22; 2, 5; 5) code and for the RLL (2, 7) modulation, K=0.08 and K=0.5, respectively. The low-range characteristics for the (4, 22; 2, 5; 5) coding and for the RLL (2, 7) modulation, with the ($T_{code}+T_{dc}$) as a parameter, are shown in FIGS. 3 and 4, respectively. As shown in FIGS. 3 and 4, the pre-set interval represented by $T_{code}$ bits is selected to be smaller and larger for the transmission system which is in need of larger low-range suppression characteristics and for the transmission system which is in need of smaller low-range suppression characteristics, respectively. In other words, the value of the pre-set interval represented by the number of $T_{code}$ bits may be selected so that the DSV control characteristics may be adapted to demands raised by the transmission system to enable the increase in redundancy to be reduced to a required minimum value.

The patterns generated by the pattern generating circuit 12 are supplied to the pattern inserting circuit 13 so as to be thereby inserted into the sequence of coded data A. As a result thereof, the DSV controlled modulated coded data, that is the modulated coded data from which the dc components or low-frequency components have been suppressed or eliminated, are outputted from the modulating circuit 14.

A preferred embodiment of the demodulating apparatus embodying the present invention is explained.

The demodulating apparatus comprises a demodulating circuit 21 for NRZI demodulating modulated signals for reproducing the sequence of encoded data interlaced with the patterns B, a pattern removing circuit 22 for removing the patterns from the sequence of coded data B from the demodulating circuit 21 for reproducing the original sequence of coded data A, a decoding circuit 23 for decoding the sequence of coded data A from the pattern removing circuit 22 for reproducing the original sequence of data, a SYNC detection circuit 24 for detecting the synchronizing signals, and a timing control circuit 25 for controlling the pattern removing circuit 22 based on the synchronizing signals as detected by the SYNC detecting circuit 24, as shown for example in FIG. 5.

The demodulating circuit 21 is supplied with modulated coded data, which are the reception or playback signals processed with equalization or bi-level processing, to perform NRZI demodulation of the modulated coded data to reproduce the sequence of coded data interlaced with the patterns corresponding to the outputs of the pattern inserting circuit 13 of the above-mentioned demodulating apparatus to supply the produced sequence of coded data B to the pattern removing circuit 22 and to the SYNC detecting circuit 24. That is, since the modulating apparatus performs DSV control so that no dc components or low-frequency components are contained in the modulated coded data, the modulated data freed of errors due to the dc components may be supplied to the demodulating circuit 21 to enable the sequence of coded data B to be reproduced.

The SYNC detection circuit 24 detects the synchronizing signals, while the timing control circuit 25 detects the position of the pattern insertion by counting the reproduced clocks based on the detected synchronizing signals to control the pattern removing circuit 22 based on the detected result.

Under control by the timing control circuit 25, the pattern removing circuit 22 removes the patterns from the sequence of coded information B interlaced with the patterns consisting of $T_{dc}$ bits inserted at the intervals of $T_{code}$ bits to reproduce the sequence of code information A. Since the patterns are inserted by the modulating device at the pre-set intervals of $T_{code}$, they may be removed easily.

The decoding circuit 23 decodes the sequence of coded information supplied from the pattern removing circuit 22 in accordance with the coding rule employed for transmission or recording to reproduce and output the original data.

With the above-described present embodiment, the sequence of coded information A is interlaced at the pre-set intervals of $T_{code}$ with the patterns having the pre-set lengths of $T_{dc}$ bits and is subsequently NRZT modulated to output DSV controlled modulated coded information. In this manner, the DSV of the modulated code may be controlled based on the number of "1"s in the inserted pattern.

On the other hand, the sequence of (d, k) coded information A is interlaced at the pre-set intervals of $T_{code}$ bits with patterns each having a length of 2 (d+1) bits and is subsequently NRZI modulated to output DSV controlled coded information. In this manner, the DSV of the modulated coded information may be controlled based on the number of "1"s in the inserted pattern. Besides, with the sequence of coded information B interlaced with the patterns satisfying the coding rule, the pattern length may be minimized and redundancy may be prevented from being increased.

Besides, by setting the pre-set interval of $T_{code}$ bits so as to be inversely proportional to the low-range cut-off Frequency $f_c$, the DSV control characteristics may be adapted to demands raised by the transmission system. That is, the increase in redundancy may be suppressed to a necessary minimum value. In other words, DSV-related constraint conditions in code designing may be eliminated to enable the optimum and versatile code to be designed easily.

Also, by employing three different patterns with the number of its of 0, 1 and 2, the increase in redundancy may be suppressed to a required minimum.

By summing the DSV upstream of the presently inserted pattern $b_1$ to the sum of the sequence of coded information $a_2$ between the pattern $b_1$ and the pattern $b_2$ to be inserted next time, and by selectively inserting one of the three patterns so as to give the least absolute sum value, the DSV may be changed significantly by employing the patterns of shorter length.

In addition, by reproducing the sequence of coded information B interlaced with the patterns by NRZI demodulation of the modulated coded information, and by removing the patterns from the sequence of coded information interlaced with the patterns B for reproducing the original sequence of coded information A, playback may be made in a manner free from errors ascribable to dc components, Meanwhile, when NRZI modulating the sequence of the (d, k) coded information for recording on e.g. an optical disc, it is preferred for the sake of recording density that the minimum length between transitions $T_{min}$ of the recorded waveform be longer, that is that the minimum run d be larger, while it is preferred from the standpoint of clock reproduction or so-called jitter that the maximum length between transitions $T_{max}$ be shorter, that is that the maximum run k be lesser.

The above-mentioned EFM, for example, is the (2, 10; 8, 17; 1) code and, with the bit-to-bit interval T of the recording waveform, the minimum length between transitions $T_{min}$ and the maximum length between transitions $T_{max}$ are 3T and 11T, respectively. With the above-mentioned (4, 22, 2, 5; 5) code, the minimum length between transitions $T_{min}$ and the maximum length between transitions $T_{max}$ are 5T and 23T, respectively. That, is, with the (4, 22; 2, 5; 5) code, the minimum distance between transitions $T_{min}$ is selected to be longer than with EFM for improving the recording density. However, the maximum length between transitions $T_{max}$ with the (4, 22; 5, 5; 5) code becomes longer. Thus the (4, 18; 2, 5; 6) code and the (4, 19; 2, 5: 5) code, having the same minimum length between transitions $T_{min}$ and having the maximum length between transitions $T_{max}$ equal to 19 and 20, respectively, have been proposed, as shown in Tables 3 and 4.

TABLE 3

| data words | | code words | | | | |
|---|---|---|---|---|---|---|
| i=1 | 11 | 10000 | | | | |
| | 10 | 01000 | | | | |
| | 01 | 00*00 | | | | |
| i=2 | 0011 | 00010 | 00000 | | | |
| | 0010 | 00001 | 0000 | | | |
| | 1011 | 00000 | 00*00 | | | |
| i=3 | 000111 | 00010 | 00010 | 00000 | | |
| | 000110 | 00010 | 00001 | 00000 | | |
| | 000101 | 00001 | 00001 | 00000 | | |
| | 000100 | 00000 | 00010 | 00000 | | |
| | 000011 | 00000 | 00001 | 00000 | | |
| i=4 | 00001011 | 00010 | 00010 | 00010 | 00000 | |
| | 00001010 | 00010 | 00010 | 00001 | 00000 | |
| | 00001001 | 00010 | 00001 | 00001 | 00000 | |
| | 00001000 | 00001 | 00001 | 00000 | 00000 | |
| | 00000111 | 00000 | 00010 | 00010 | 00000 | |
| | 00000110 | 00000 | 00010 | 00001 | 00000 | |
| | 00000101 | 00000 | 00001 | 00001 | 00000 | |
| | 00000100 | 00000 | 00000 | 0000 | 00*00 | |
| i=5 | 0000001111 | 01000 | 00000 | 00000 | 00010 | 00000 |
| | 0000001110 | 01000 | 00000 | 00000 | 00001 | 00000 |
| | 0000001101 | 00100 | 00000 | 00000 | 00010 | 00000 |
| | 0000001100 | 00100 | 00000 | 00000 | 00001 | 00000 |
| | 0000001011 | 00010 | 00010 | 00010 | 00010 | 00000 |
| | 0000001010 | 00010 | 00010 | 00010 | 00001 | 00000 |
| | 0000001001 | 00010 | 00010 | 00001 | 00001 | 00000 |
| | 0000001000 | 00010 | 00001 | 00001 | 00001 | 00000 |
| | 0000000111 | 00001 | 00001 | 00001 | 00001 | 00000 |
| | 0000000110 | 00000 | 00010 | 00010 | 00010 | 00000 |
| | 0000000101 | 00000 | 00010 | 00010 | 00001 | 00000 |
| | 0000000100 | 00000 | 00010 | 00001 | 00001 | 00000 |
| | 000000011 | 00000 | 00001 | 00001 | 00001 | 00000 |

TABLE 3-continued

| data words | code words | | | | | | |
|---|---|---|---|---|---|---|---|
| | 0000000010 | 00000 | 00000 | 00100 | 00010 | 00000 | |
| | 0000000001 | 00000 | 00000 | 00100 | 00001 | 00000 | |
| i=6 | 000000000011 | 00010 | 00010 | 00010 | 00010 | 00010 | 00000 |
| | 000000000010 | 00010 | 00010 | 00010 | 00010 | 00001 | 00000 |
| | 000000000001 | 00010 | 00010 | 00010 | 00001 | 00001 | 00000 |
| | 000000000000 | 00010 | 00010 | 00001 | 00001 | 00001 | 00000 |
| | ASYNC | | | 19T | 17T | 14bit | |
| | BSYNC | | | 18T | 19T | 13bit | |

TABLE 4

| data words | code words | | | | | |
|---|---|---|---|---|---|---|
| i=1 | 11 | 10000 | | | | |
| | 10 | 01000 | | | | |
| | 01 | 00*00 | | | | |
| i=2 | 0011 | 00010 | 00000 | | | |
| | 0010 | 00001 | 00000 | | | |
| | 0011 | 00000 | 00*00 | | | |
| i=3 | 000111 | 00010 | 00010 | 00000 | | |
| | 000110 | 00010 | 00001 | 00000 | | |
| | 000101 | 00001 | 00001 | 00000 | | |
| | 000100 | 00000 | 00010 | 00000 | | |
| | 000011 | 00000 | 00001 | 00000 | | |
| i=4 | 00001011 | 00010 | 00010 | 00010 | 00000 | |
| | 00001010 | 00010 | 00010 | 00001 | 00000 | |
| | 00001001 | 00010 | 00001 | 00001 | 00000 | |
| | 00001000 | 00001 | 00001 | 00001 | 00000 | |
| | 00000111 | 00000 | 00010 | 00010 | 00000 | |
| | 00000110 | 00000 | 00010 | 00001 | 00000 | |
| | 00000101 | 00000 | 00001 | 00001 | 00000 | |
| | 00000100 | 00000 | 00000 | 00100 | 00*00 | |
| | 00000011 | 00000 | 00000 | 00010 | 000*0 | |
| i=5 | 0000001101 | 00010 | 00010 | 00010 | 00010 | 00000 |
| | 0000001010 | 00010 | 00010 | 00010 | 00001 | 00000 |
| | 0000001001 | 00010 | 00010 | 00001 | 00001 | 00000 |
| | 0000001000 | 00010 | 00001 | 00001 | 00001 | 00000 |
| | 0000000111 | 00001 | 00001 | 00001 | 00001 | 00000 |
| | 0000000110 | 00000 | 00010 | 00010 | 00010 | 00000 |
| | 0000000101 | 00000 | 00010 | 00001 | 00001 | 00000 |
| | 0000000100 | 00000 | 00010 | 00001 | 00001 | 00000 |
| | 0000000011 | 00000 | 00001 | 00001 | 00001 | 00000 |
| | 0000000010 | 00000 | 00000 | 00100 | 00010 | 00000 |
| | 0000000001 | 00000 | 00000 | 00100 | 00001 | 00000 |
| | 0000000000 | 00000 | 00000 | 00010 | 00001 | 00000 |
| | ASYNC | | 20T | 19T | 11bit | |
| | BSYNC | | 19T | 18T | 13bit | |

In the above Tables 3 and 4, the bits indicated by asterisks * are indefinite bits to be determined by the number of succeeding or preceding "0"s.

It is noted that, if the above-described embodiment concerning the (4, 22; 2, 5; 5) code is directly applied to the (4, 18; 2, 5; 6) or (4, 19; 2, 5; 5) codes, it may occur that, depending on the pattern inserting positions, the coding rule concerning the maximum run length $k$ (the maximum length between transitions) cannot be satisfied. For example, if, in the (4, 18; 2, 5; 6) code, the data is "0011 00000100", the sequence of coded information becomes "0001000000 0000000000010000*00". If the above-mentioned odd "1" number group pat-tern of "0000100000" is inserted between the lower 10th and the 11th bits of the sequence of coded information A for inverting the downstream side logical state, the maximum length between transitions $T_{max}$ becomes 21T, thus not satisfying the coding rule. The algorithm which may be employed both for the (4, 18; 2, 5; 6) code and the (4, 19; 2, 5; 5) code will be hereinafter explained.

For these (4, 18; 2, 5; 6) code and the (4, 19; 2, 5; 5) codes, three different patterns having the number of 0, 1 and 2, namely the even "1" number group patterns having the number of "1"s of inverting the logical state downstream of the inserted patterns equal to 1, referred to herein as the inverting pattern, and the odd "1" number group pattern having the number of "1"s of not inverting the logical state equal to 0 or 2, referred to herein as non-inverting pattern, are employed, as in the previous embodiment. However, the patterns are determined in the present embodiment based on (d+1) bits before and after the pattern insertion.

The pattern generating circuit 12 is made up of a DSV calculating circuit 12a for calculating the DSV value, a direct-preceding and direct-succeeding bit processing circuit 12b for storing the (d+1) bits before and after pattern insertion, and a pattern decision circuit 12c for summing the DSV upstream of the presently inserted pattern to the DSV of the code sequence between the presently inserted pattern and the pattern inserted next time, as supplied from the DSV calculating circuit 12a, and selecting the pattern based on the (d+1) bits stored in the circuit 12b, as shown for example in FIG. 6.

The pattern decision circuit 12c selects the pattern using the directly succeeding (d+1) bits if "1"s are not present in the (d+1) bits immediately before the pattern insertion and "1"s are present in the immediately succeeding (d+1) bits, while selecting the pattern using the directly succeeding (d+1) bits if "1"s are present in the (d+1) bits immediately before the pattern insertion and "1"s are not present in the immediately succeeding (d+1) bits.

TABLE 5

| directly preceding (d+1)bits | directly following (d+1)bits | upper(d+1) bits of pattern | lower(d+1) bits of pattern |
|---|---|---|---|
| all "0" | all "0" | all "0" | (d+1)th bit "1" |
| all "0" | "1" present | directly following (d+1)bits | all "0" |
| "1" present | all "0" | all "0" | directly preceding (d+1)th bits |
| "1" present | "1" present | all "0" | (d+1)th bit "1" |

TABLE 6

| directly preceding (d+1)th bit | directly following (d+1)th bit | upper(d+1)bits of pattern | lower(d+1) bits of pattern |
|---|---|---|---|
| all "0" | all "0" | satisfies "d" and includes two "1"s | |
| all "0" | "1" present | directly following(d+1) bits | directly following (d+1)bits |

TABLE 6-continued

| directly preceding (d+1)th bit | directly following (d+1)th bit | upper(d+1)bits of pattern | lower(d+1) bits of pattern |
|---|---|---|---|
| "1" present | all "0" | directly preceding(d+1) bits | directly following (d+1) bits |
| "1" present | "1" present | directly preceding(d+1) bits | directly following (d+1)bits |

Specifically, as shown in the above Tables 5 and 6, if "1"s are not present in the (d+1) bits immediately before pattern insertion nor in the (d+1) bits immediately after pattern insertion, the pattern is the first inverting pattern in which only the (d+1)th bit counted from the lower most bit as the first bit is "1" or the first non-inverting pattern having two "1" and satisfying the coding rule of the (d, k) code, whereas, if "1" is not contained in the immediately preceding (d+1) bits and "1" is present in the immediately succeeding (d+1) bits, the pattern is the second inverting bit having its upper (d+1) bits equal to the immediately succeeding (d+1) bits and its lower (d+1) bits all equal to 0, or the second non-inverting pattern made up of the immediately succeeding (d+1) bits repeated twice. On the other hand, if "1" is present in the immediately preceding (d+1) bits and "1" is not present in the immediately succeeding (d+1) bits, the pattern is the third inverting pattern having its upper (d+1) bits all 0 and having its lower (d+1) bits equal to the immediately preceding (d+1) bits or the third non-inverting pattern made up of the immediately preceding (d+1) bits repeated twice and, if "1" is contained in each of the immediately preceding and immediately succeeding (d+1) bits, the pattern is the first inverting pattern or the all-0 fourth inverting pattern.

That is, if, for the (4, 18; 2, 5; 6) code or the (4, 2, 5; 5) code having the minimum run $\underline{d}$ equal to 4, the 5 (= 4+1) bits directly before and directly after the pattern insertion is "00000", thus without "1", the pattern is the first inverting pattern in which the only fifth or the (4+ 1)st bit, as counted from the lower most bit (LSB) as the first bit, is "1", that is a pattern "0000010000" or the first non-inverting pattern having two "1"s and satisfying the condition of d=4, such as the patterns "0010000100" or "0100001000".

If "1" is not present in the directly preceding five bits and present in the directly succeeding five bits, the pattern is set to the second non-inverting pattern having its upper five bits equal to the directly succeeding five bits and having its lower five bits of "00000", or the second non-inverting pattern made up of the directly succeeding five bits repeated twice.

If "1" is present in the directly preceding five bits and not present in the directly succeeding five bits, the pattern is set to the third non-inverting pattern having its upper five bits equal to "00000" and having its lower five bits equal to the directly preceding five bits, or the third non-inverting pattern having the directly preceding five bits repeated twice.

If "1" is present in each of the directly previous five bits and the directly succeeding five bits, the pattern is set to the first inverting pattern equal to "0000010000" or the fourth non-inverting pattern made up of the same bits as the directly preceding five bits and directly following five bits. If the condition shown by the equation 4 is satisfied, the fourth non-inverting pattern may be set to "0000000000".

$$2(2d+1) \leq k \qquad \text{Equation 4}$$

Besides, if the condition shown by the following equation 5 holds, the fourth inverting pattern may be set based on $\underline{x}$ bits before and after the pattern insertion, shown by the equations 6 and 7.

$$2d < k < 2(2d+1) \qquad \text{Equation 5}$$

For $\underline{d}$ as an even number, $$x = d/2 \qquad \text{Equation 6}$$

For $\underline{d}$ as an odd number, $$x = (2d+1)/2 \qquad \text{Equation 7.}$$

Specifically, if "1" is not present in $\underline{x}$ bits directly before and directly after the pattern insertion, the fourth inverting pattern is so set that the (x+1)th bit as counted from the left end (MSB side end) of the upper (d+1) bits is set to 1 and the (x+1)th bit as counted from the left end of the lower (d+1) bits is set to 1, as shown in the following Table 7. For example, if, for d=4 as mentioned above and directly preceding and directly succeeding 2 (=4/2) bits are both "00", the fourth inverting pattern is set to "0010000100".

TABLE 7

| directly preceding x bits | directly following x bits | upper (d+1) bits of pattern | lower (d+1) bits of pattern |
|---|---|---|---|
| all "0" | all "0" | (x+1)th bit from left is "1" | (x+1)th bit from left is "1" |
| all "0" | yth bit from left is "1" | yth bit from left is "1" | yth bit from left is "1" |
| zth bit from right is "1" | all "0" | zth bit from right is "1" | zth bit from right is "1" |

If "1" is not present in the immediately preceding $\underline{x}$ bits and the yth bit as counted from the left end of the immediately succeeding $\underline{x}$ bits is 1, the fourth non-inverting pattern is so set that the yth bit as counted from the left end of the upper (d+1) bits is 1 and the yth bit as counted from the left end of the lower (d+1) bits is 1. For example, if the pattern is directly preceded by two bits of "00" and directly followed by two bits of "01", y is equal to 2 such that the fourth inverting pattern becomes "0100001000". If, on the other hand, the pattern is directly preceded by two bits of "00" and directly followed by two bits of "10", y is equal to 1 such that the fourth inverting pattern becomes "1000010000".

If the zth bit as counted from the right end (LSB side) of the immediately previous $\underline{x}$ bits is 1 and 1 is not present in the immediately succeeding $\underline{x}$ bits, the fourth non-inverting pattern is so set that the zth bit as counted from the right end of the upper (d+1) bits is 1 and the zth bit as counted from the right end of the lower (d+1) bits is 1. For example, if the pattern is directly preceded by two bit of "01" and directly followed by two bits of "00", z becomes equal to 1 such that the fourth inverting pattern becomes "0000100001". On the other hand, if the pattern is directly preceded by two bit of "10" and directly followed by two bits of "00", z becomes equal to 2 such that the fourth inverting pattern becomes "0001000010".

A concrete example in which the above-mentioned algorithm is adapted to RLL (2, 7) modulation is hereinafter explained.

If 3 (=2+1) bits directly before and after the pattern insertion are "000", that is free of 1, the pattern is set to the first inverting pattern in which only the third (=2+ 1th) bit as counted from the LSB as the first bit is 1, or a pattern "000100" or the first non-inverting pattern having at least two "1"s and satisfying the condition of d=2, such as patterns "010010", "100100" or "001001".

If 1 is not present in immediately preceding three bit, and 1 is present in immediately succeeding three bits, the pattern is set to the second inverting pattern having its Upper three bits equal to the immediately succeeding three bits and having its lower three bits equal to "000", or the second non-inverting pattern composed of the same bits as the directly following three bits repeated twice.

If 1 is present in immediately preceding three bit, and 1 is not present in immediately succeeding three bits, the pattern is set to the third inverting pattern having its upper three bits equal to "000" and having its lower three bits equal to immediately previous three bits, or the third non-inverting pattern composed of the same bits as the directly preceding three bits.

If 1 is present in both the directly preceding three bits and the directly succeeding three bits, the pattern is set to the first inverting pattern which is "00100" or the fourth non-inverting pattern made up of the same bits as the directly preceding three bits and the directly following three bits. Meanwhile, since the condition shown by the equation 4 is not valid with the present RLL (2, 7) modulation, the pattern "000000" cannot be employed.

However, since the condition shown by the equation 5 is valid, the fourth inverting pattern may be set based on the 1 (=2/2) bit before and after the pattern insertion. That is, if the pattern is directly preceded by one bit "0" and directly followed by one bit "0", the fourth non-inverting pattern is set to "010010".

If the pattern is directly preceded by one bit "0" and directly followed by one bit "1", $\underline{y}$ becomes equal to 1 such that the fourth non-inverting pattern is "100100".

For example, if the pattern is directly preceded by one bit "1" and directly followed by one bit "0", $\underline{z}$ becomes equal to 1 such that the fourth non-inverting pattern is "001001".

The pattern decision circuit 12c sums the DSV upstream of the presently inserted pattern $b_1$ and the DSV of the sequence of coded information between the pattern $b_1$ and a pattern $b_2$ to be inserted next time and selects one of the above-defined inverting and non-inverting patterns which will minimize the absolute sum value to transmit the selected pattern to the pattern inserting circuit 13. The pattern inserting circuit inserts the selected patterns at the pre-set intervals of $T_{code}$. Meanwhile, the pro-set interval of $T_{code}$ may be of an arbitrary value, such as 320T of channel bits.

Thus, when inserting patterns each having a length of 2 (d+1) bits at a pro-set interval of $T_{code}$ bits into the sequence of (d, k) coded information, and NRZI modulating the sequence of the code information interlaced with the patterns B for outputting the DSV controlled modulated coded information, the patterns may be selected on the basis of the (d+1) bits preceding and succeeding the pattern insertion and the minimum length between transitions $T_{min}$ may be increased for improving e.g. the recording density of the recording medium.

It is to be noted that the present invention is not limited to the above-described illustrative embodiments and may be applied to, for example, so-called synchronizing signals. Specifically, in the (4, 22; 2, 5; 5) code, for example, two different, synchronizing signals, namely a synchronizing signal which is composed of 50 bits of 23T, 21T and 6T and in which three transitions occur (ASYNC), and a synchronizing signal which is composed of 50 bits of 21T, 23T and 6T and in which three transitions occur (BSYNC), as shown in Table 2, are employed. On the (4, 18; 2, 5; 6) code, for example, two different, synchronizing signals composed of 50 bits of 19T, 17T and 14 bits and in which four transitions occur (ASYNC), and a synchronizing signal in which three transitions occur and which is composed of 21T, 23T and 6T (BSYNC), as shown in Table 3, are employed. On the other hand, in the (4, 19; 2, 5; 5) code, for example, two synchronizing signals composed of 50 bits of 20T, 19T and 11 bits and having four transitions (ASYNC) and a synchronizing signal having four transitions and made up of 19T, 18T and 13 bits (BSYNC), are employed. The selected pattern is inserted into 2 (d+1)=10 bits following these synchronizing signals in accordance with the above-described algorithm for DSV control.

Effect of the Invention

It will be appreciated from the foregoing that, in accordance with the present invention, by inserting patterns each having a pre-set length into the sequence of coded information at a pre-set interval and subsequently NRZI modulating the sequence interlaced with the patterns for outputting the DSV controlled modulated coded information, the DSV of the modulated coded information may be controlled on the basis of the number of inserted "1"s.

Also, by inserting the patterns each having a length equal to 2 (d+1) bits into the sequence of (d, k) coded information at a pre-set interval, NRZI modulating the resulting sequence of coded information interlaced with the patterns, and outputting the sequence of the DSV controlled modulated coded information, the DSV of the modulated coded information may be controlled on the basis of the number of inserted "1"s, while the pattern length may be minimized and the redundancy may be prevented from being increased, with the pattern-interlaced sequence of the coded information perpetually meeting the coding rule.

Besides, by setting the pre-set interval so as to be inversely proportionate to the low-range cut-off frequency, the DSV control characteristics may be adapted to the demand raised by the transmission system. That is, the increase in redundancy may be suppressed to a necessary minimum value. In other word, DSV-related constraint conditions in code designing may be eliminated to enable the optimum and versatile code to be designed easily.

On the other hand, by employing the three patterns having the number of "1"s of 0, 1 and 2, the increase in redundancy may be suppressed to a necessary minimum value.

By summing the DSV upstream of the currently inserted pattern to the DSV of the sequence of coded information between the currently inserted pattern and the pattern to be inserted next, and by selectively inserting one of the three different patterns which will diminish the absolute value of the sum to a minimum, the DSV may be changed significantly by the patterns of shorter lengths.

By reproducing the pattern-interlaced sequence of coded information by NRZI demodulating the modulated coded information, and by removing the patterns from the pattern-interlaced sequence of coded information for reproducing the sequence of original coded information, playback may be achieved in a manner free from errors ascribable to dc components.

Besides, when inserting patterns each having a length of 2 (d+1) bits at a pre-set interval into the sequence of (d, k) coded information, and NRZI modulating the sequence of the code information interlaced with the patterns for outputting the DSV controlled modulated coded information, the patterns may be selected on the basis of the (d+1) bits before and after the pattern insertion, such that DSV control may be realized while the coding rule remains satisfied.

Also, by employing (d+1) bits before and after the pattern insertion, the frequency of occurrence of the minimum length between transitions $T_{min}$ may be increased, as a result of which the recording density of the recording medium may be increased.

Explanation of Numerals

Figure 1:
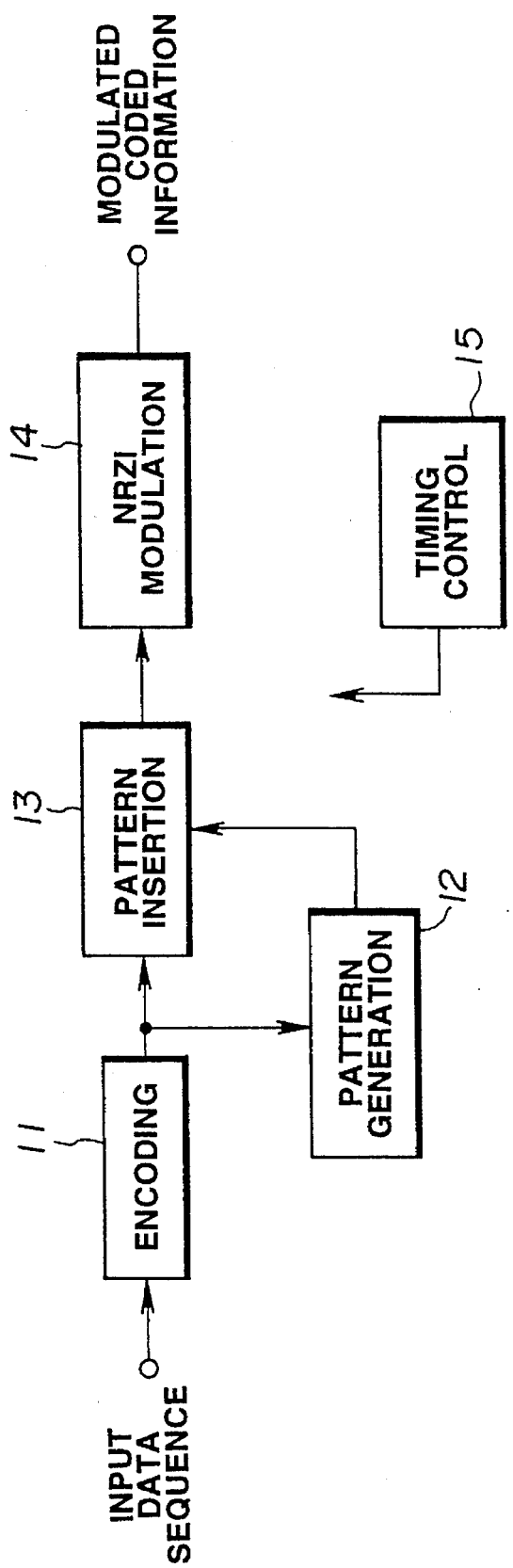
FIG. 1 is a block view illustrating the essential portions of the circuit arrangement of a modulating device according to the present invention.
Figure 2:
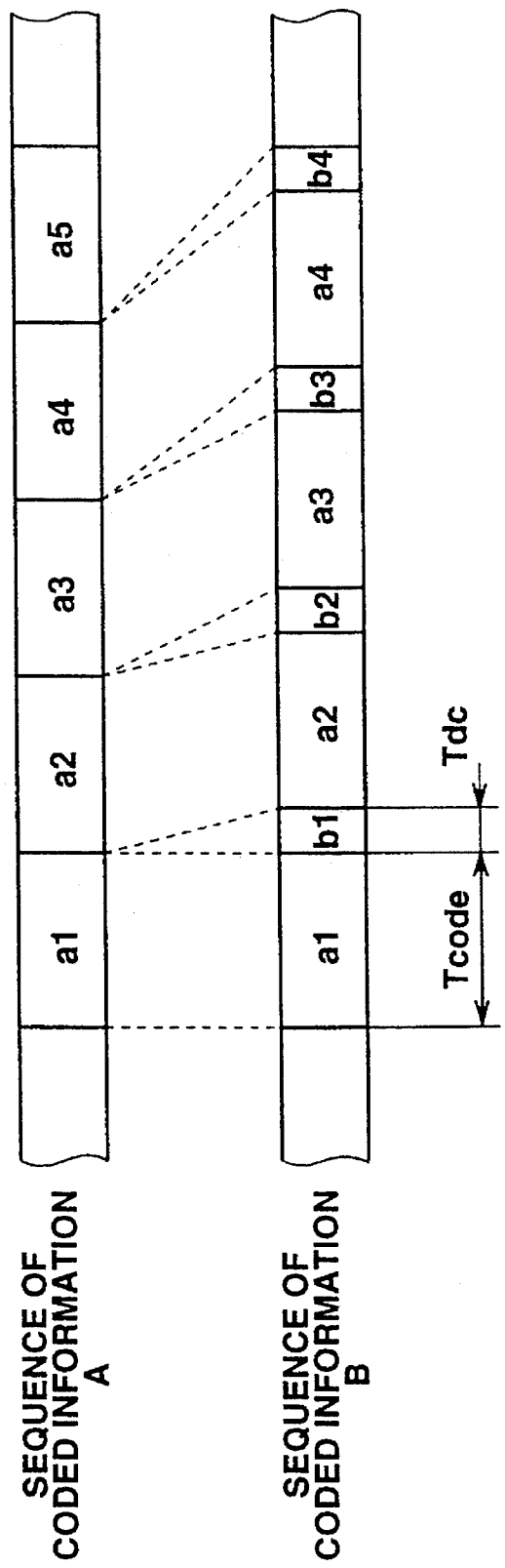
FIG. 2 is a timing chart got illustrating the operating principle of the modulating device shown in FIG. 1.
Figure 3:
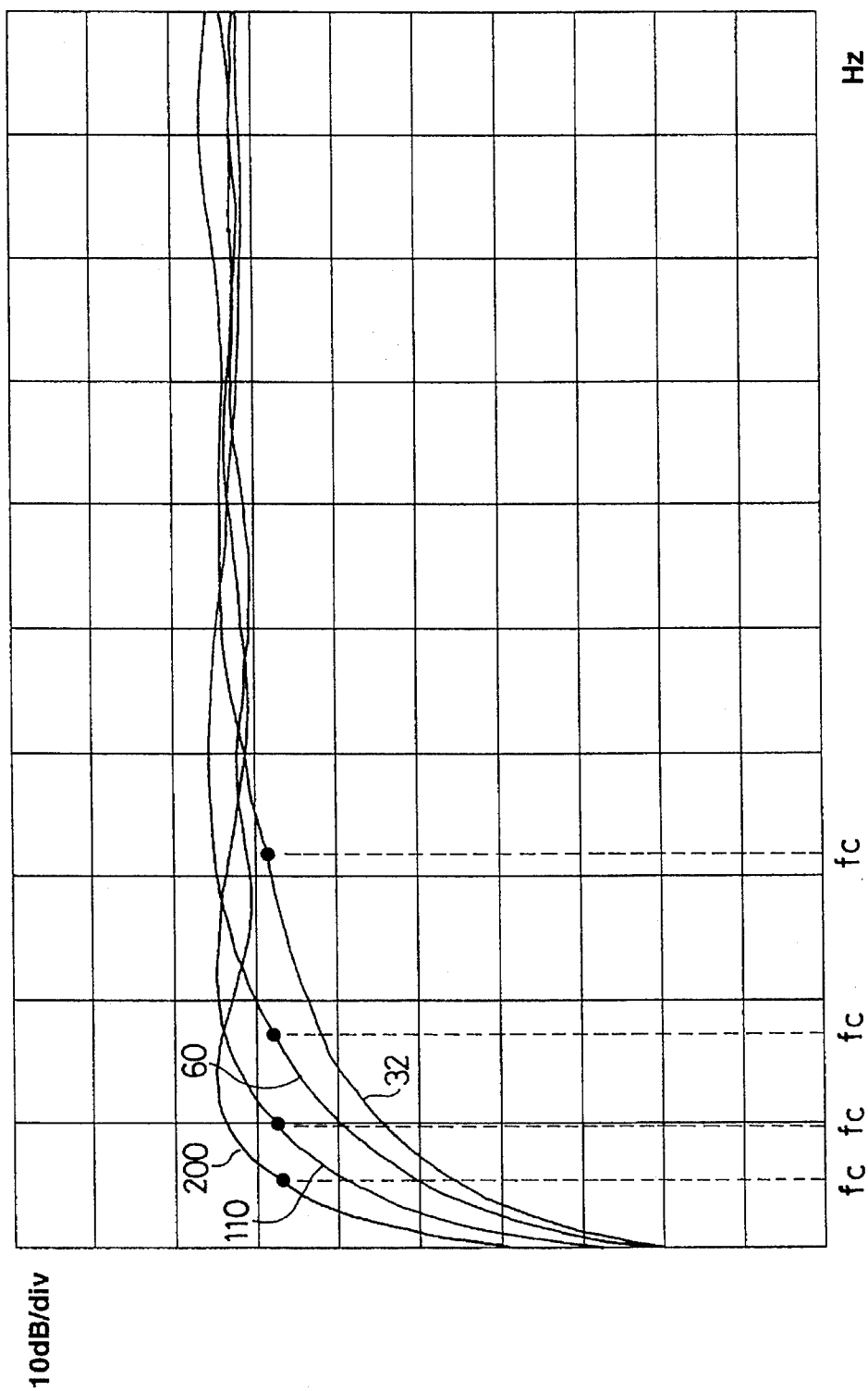
FIG. 3 shows low-frequency characteristics of the modulated coded information when the (2, 22; 2, 5; 5) code is employed.
Figure 4:
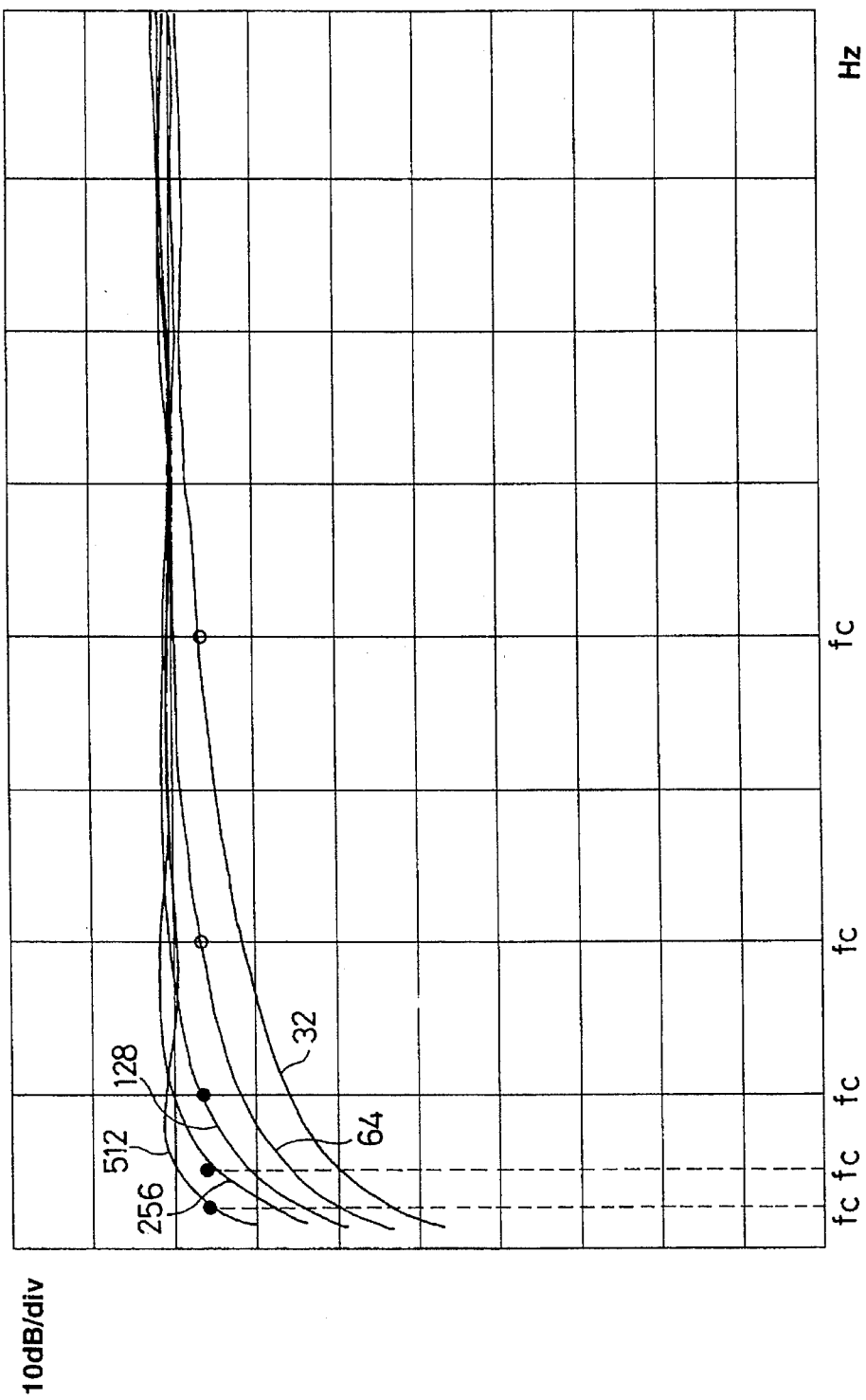
FIG. 4 shows low-frequency characteristics of the modulated coded information when the RLL (2, 7) modulation is employed.
Figure 5:
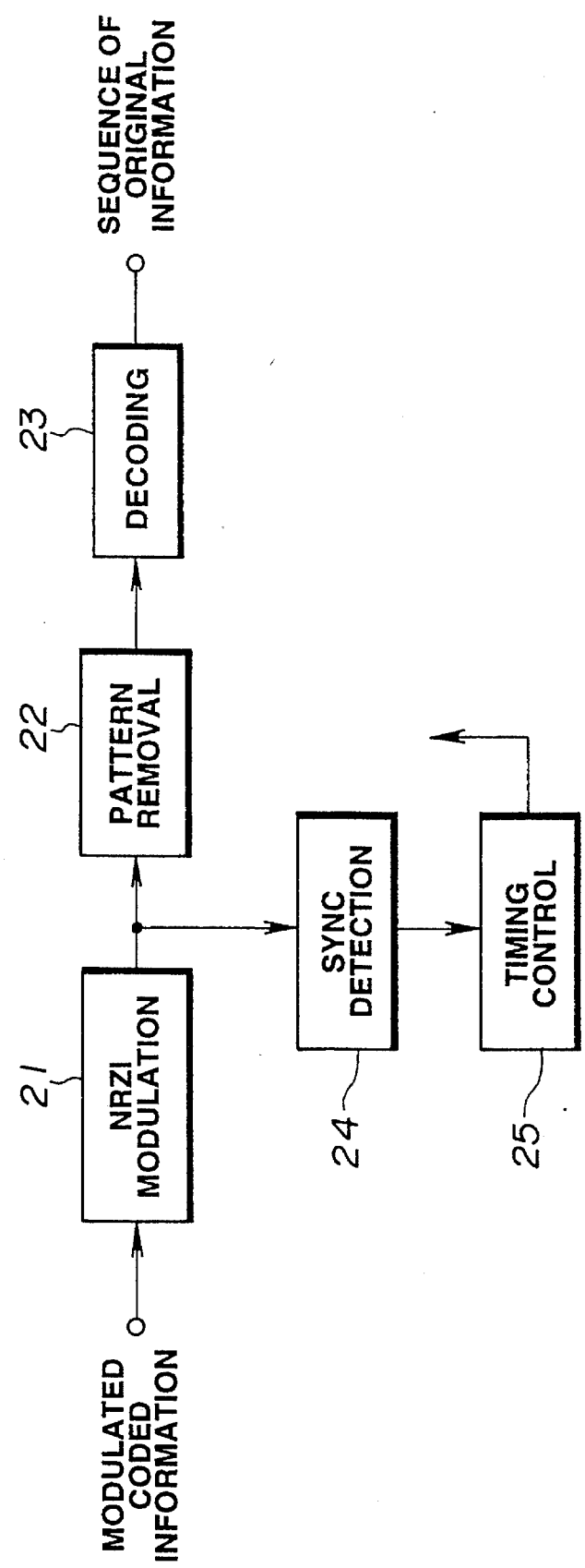
FIG. 5 is a block view showing essential portions of the circuit arrangement of a demodulating device according to the present invention.
Figure 6:
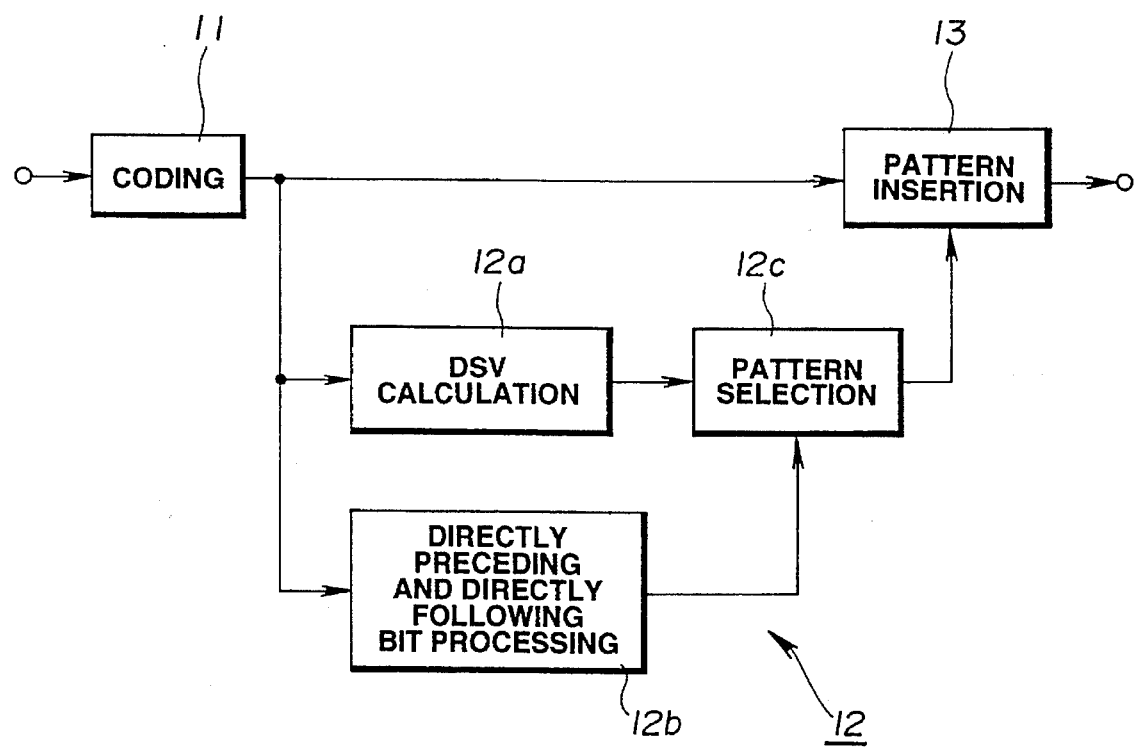
FIG. 6 is a block view showing a concrete circuit arrangement of a pattern generating circuit of the modulating device shown in FIG. 1.

11—encoding circuit; 12—pattern generating circuit; 12a—DSV calculating circuit; 12b—directly-previous and directly-following bit processing circuit; 12c—pattern decision circuit; 13—pattern inserting circuit; 14— modulating circuit; 15—timing control circuit; 21— demodulating circuit; 22—pattern removing circuit; 23 — decoding circuit; 25—timing control circuit.

What is claimed is:

1. A modulating method, comprising the steps of:
   inserting patterns each having a pre-set length into a sequence of coded information at a pre-set interval; and
   NRZI modulating the sequence of coded information interlaced with the patterns for outputting the DSV controlled modulated code,
   NRZI modulating the sequence of coded information interlaced with the patterns for outputting the DSV controlled modulated code, wherein the pre-set interval is of a value inversely proportional to a low-range cut-off frequency of the NRZI modulated sequence of coded information.

2. The modulating method as claimed in claim 1, wherein said patterns comprise three different patterns, that is a pattern with 0 "1", a pattern with 1 "1" and a pattern with 2 "1"s.

3. The modulating method as claimed in claim 2, further comprising the steps of:
   summing the DSV upstream of a currently inserted pattern to the DSV of a sequence of coded information between the currently inserted pattern and a pattern to be inserted next time; and
   selectively inserting one of said three different patterns which will give the smallest absolute sum value.

4. A modulating method, comprising the steps of:
   inserting a pattern having a length equal to 2 (d+1) bits at a pre-set interval into a sequence of (d, k) coded information; and
   NRZI modulating the sequence of (d, k) coded information interlaced with said patterns for outputting the DSV controlled modulated coded information.

5. The modulating method as claimed in claim 4, wherein said pre-set interval is of a value inversely proportional to a low-range cut-off frequency of the modulated coded information.

6. The modulating method as claimed in claim 5, wherein said patterns comprise three different patterns, that is a pattern with 0 "1", a pattern with 1 "1" and a pattern with 2 "1"s.

7. The modulating method as claimed in claim 6, further comprising the steps of:
   summing the DSV upstream of a currently inserted pattern to the DSV of a sequence of coded information between the currently inserted pattern and a pattern to be inserted next time; and
   selectively inserting one of said three different patterns which will give the smallest absolute sum value.

8. The modulating method as claimed in claim 4, wherein said patterns comprise three different patterns, that is a pattern with 0 "1", a pattern with 1 "1" and a pattern with 2 "1"s.

9. The modulating method as claimed in claim 8, further comprising the steps of:
   summing the DSV upstream of a currently inserted pattern to the DSV of a sequence of coded information between the currently inserted pattern and a pattern to be inserted next time; and
   selectively inserting one of said three different patterns which will give the smallest absolute sum value.

10. A modulating device, comprising:
    pattern inserting means for inserting patterns each being of a pre-set length into a sequence of coded information, and
    modulating means for NRZI modulating the sequence of coded information interlaced with the patterns from said pattern inserting means,
    said modulating means outputting the sequence of DSV controlled modulated coded information, wherein said pattern inserting means insert the patterns at a pre-set interval inversely proportional to a low-range cut-off frequency of said NRZI modulated sequence of coded information.

11. The modulating device as claimed in claim 10, wherein said pattern inserting means select and insert one of three different patterns, that is a pattern with 0 "1", a pattern with 1 "1" and a pattern with 2 "1"s.

12. The modulating device as claimed in claim 11, further comprising:
    control means for causing said pattern inserting means to sum the DSV upstream of a currently inserted pattern to the DSV of a sequence of coded information between the currently inserted pattern and a pattern to be inserted next time and to selectively insert one of said three different patterns which will give the smallest absolute sum value.

13. A modulating device, comprising:
    pattern inserting means for inserting patterns each being of a length equal to 2 (d+1) bits into a sequence of (d, k) coded information at a pre-set interval, and
    modulating means for NRZI modulating the sequence of (d, k) coded information interlaced with the patterns from said pattern inserting means,
    said modulating means outputting the DSV controlled modulated coded information.

14. The modulating device as claimed in claim 13, wherein said pattern inserting means insert the patterns at a pre-set interval inversely proportional to a low-range cut-off frequency of said modulated code information.

15. The modulating device as claimed in claim 14, wherein said pattern inserting means select and insert one of a pattern with 0 "1", a pattern with 1 "1" and a pattern with 2 "1"s.

16. The modulating device as claimed in claim 15, further comprising:

control means for causing said pattern inserting means to sum the DSV upstream of a currently inserted pattern to the DSV of a sequence of coded information between the currently inserted pattern and a pattern to be inserted next time and to selectively insert one of said three different patterns which will give the smallest absolute sum value.

17. The modulating device as claimed in claim 13, wherein said pattern inserting means select and insert one of a pattern with 0 "1", a pattern with 1 "1" and a pattern with 2 "1"s.

18. The modulating device as claimed in claim 17, further comprising:

control means for causing said pattern inserting means to sum the DSV upstream of a currently inserted pattern to the DSV of a sequence of coded information between the currently inserted pattern and a pattern to be inserted next time and to selectively insert one of said three different patterns which will give the smallest absolute sum value.

19. A modulating method, comprising the steps of:

inserting patterns each being of a length equal to 2 (d+1) bits into a sequence of (d, k) coded information at a preset interval, NRZI modulating the sequence of (d, k) coded information interlaced with the patterns from said pattern inserting means; and outputting the sequence of DSV controlled modulated coded information, said patterns being selected on the basis of (d+1) bits preceding and following insertion of said patterns.

20. The modulating method as claimed in claim 19, further comprising the steps of:

selecting said patterns on the basis of (d+1) bits directly following the pattern if 1 is not present in (d+1) bits directly preceding the insertion of said patterns and 1 is present in the (d+1) bits directly following the insertion of said patterns, and selecting said patterns on the basis of the (d+1) bits directly preceding the pattern if 1 is present in the (d+1) bits directly preceding the insertion of said patterns and 1 is not present in the (d+1) bits directly following the insertion of said patterns.

21. The modulating method as claimed in claim 20, wherein if 1 is not present in the (d+1) bits immediately preceding the inserted pattern nor in the (d+1) bits immediately following the inserted pattern, said pattern is set to a first inverting pattern in which only the (d+1)th bit as counted from the least significant bit as the first bit is 1 or to a first non-inverting pattern having two "1"s and satisfying the coding rule of said (d, k) code, if 1 is not present in the immediately preceding (d+1) bits and 1 is present in the immediately following (d+1) bits, said pattern is set to a second inverting pattern having its upper (d+1) bits equal to said immediately preceding (d+1) bits and having its lower (d+1) bits all 0, or to a second non-inverting pattern in which said immediately following (d+1) bits are repeated twice, if 1 is present in the immediately preceding (d+1) bits and 1 is not present in the immediately following (d+1) bits, said pattern is set to a third inverting pattern having its upper (d+1) bits all 0 and having its lower (d+1) bits equal to said immediately preceding (d+1) bits or to a third non-inverting pattern in which said immediately preceding (d+1) bits are repeated twice, and if 1 is present in both of said immediately preceding (d+1) bits and said immediately following (d+1) bits, said pattern is set to said first inverting pattern or a fourth non-inverting pattern consisting of said immediately preceding (d+1) bits and said immediately following (d+1) bits.

22. The modulating method as claimed in claim 21 wherein, if the relation 2d<k<(2d+1) holds, said fourth non-inverting pattern is selected on the basis of d/2 bits, $\underline{d}$ being an even number, preceding and following the insertion of said pattern, or (d+1)/2 bits, $\underline{d}$ being an odd number, preceding and following the insertion of said pattern.

23. The modulating method as claimed in claim 22, further comprising the steps of:

summing the DSV upstream of a currently inserted pattern to the DSV of a sequence of coded information between the currently inserted pattern and a pattern to be inserted next time; and selecting said inverting patterns or said noninverting patterns so that the absolute sum value becomes the least.

24. The modulating method as claimed in claim 21, further comprising the steps of:

summing the DSV upstream of a currently inserted pattern to the DSV of a sequence of coded information between the currently inserted pattern and a pattern to be inserted next time; and selecting said inverting patterns or said noninverting patterns so that the absolute sum value becomes the least.

25. The modulating method as claimed in claim 19, wherein if 1 is not present in the (d+1) bits immediately preceding the inserted pattern nor in the (d+1) bits immediately following the inserted pattern, said pattern is set to a first inverting pattern in which only the (d+1)th bit as counted from the least significant bit as the first bit is 1 or to a first non-inverting pattern having two "1"s and satisfying the coding rule of said (d, k) code, if 1 is not present in the immediately preceding (d+1) bits and 1 is present in the immediately following (d+1) bits, said pattern is set to a second inverting pattern having its upper (d+1) bits equal to said immediately following (d+1) bits and having its lower (d+1) bits all 0, or to a second non-inverting pattern in which said immediately following (d+1) bits are repeated twice, if 1 is present in the immediately preceding (d+1) bits and 1 is not present in the immediately following (d+1) bits, said pattern is set to a third inverting pattern having its upper (d+1) bits all 0 and having its lower (d+1) bits equal to said immediately preceding (d+1) bits or to a third non-inverting pattern in which said immediately preceding (d+1) bits are repeated twice, and if 1 is present in both of said immediately preceding (d+1) bits and said immediately following (d+1) bits, said pattern is set to said first inverting pattern or a fourth non-inverting pattern consisting of said immediately preceding (d+1) bits and said immediately following (d+1) bits.

26. The modulating method as claimed in claim 25 wherein, if the relation 2d<k<(2d+1) holds, said fourth non-inverting pattern is selected on the basis of d/2 bits, $\underline{d}$ being an even number, preceding and following the insertion of said pattern, or (d+1)/2 bits, $\underline{d}$ being an odd number, preceding and following the insertion of said pattern.

27. The modulating method as claimed in claim 26, further comprising the steps of:

summing the DSV upstream of a currently inserted pattern to the DSV of a sequence of coded information between the currently inserted pattern and a pattern to be inserted next time; and selecting said inverting patterns or said non-inverting patterns so that the absolute sum value becomes the least.

28. The modulating method as claimed in claim 25, further comprising the steps of:

summing the DSV upstream of a currently inserted pattern to the DSV of a sequence of coded information between the currently inserted pattern and a pattern to be inserted next time; and selecting said inverting patterns or said non-inverting patterns so that the absolute sum value becomes the least.

29. A demodulating device, comprising:

demodulating means supplied with a sequence of modulated coded information, said sequence of modulated coded information having been interlaced with patterns at a pre-set interval inversely proportional to a low-range cut-off frequency of the sequence of modulated coded information, and subsequently NRZI modulated with DSV control, said patterns being each of a pre-set length, said demodulating means NRZI demodulating said sequence of modulated coded information and reproducing said sequence of coded information interlaced with the patterns; and pattern removing means for removing the patterns from the sequence of coded information interlaced with said patterns from said demodulating means for reproducing the original sequence of coded information.

30. A demodulating method for demodulating a sequence of modulated coded information, said sequence of modulated coded information having been interlaced with patterns at a pre-set interval inversely proportional to a low-range cut-off frequency of the sequence of modulated coded information, and subsequently NRZI modulated with DSV control, said patterns being each of a pre-set length, comprising the steps of:

demodulating said sequence of modulated coded information and reproducing said sequence of coded information interlaced with the patterns; and removing the patterns from the sequence of coded information interlaced with said patterns from said demodulating means for reproducing the original sequence of coded information.

\* \* \* \* \*